US012754599B2

(12) United States Patent
Anand et al.

(10) Patent No.: US 12,754,599 B2
(45) Date of Patent: Oct. 6, 2026

(54) METHOD AND SYSTEM FOR SUPPORTING MEMORY FUNCTIONS DURING LOW POWER MODES OF A PORTABLE COMPUTING DEVICE (PCD)

(71) Applicant: Qualcomm Incorporated, San Diego, CA (US)

(72) Inventors: Abhishek Anand, San Diego, CA (US); Jeremy Gilbert, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 89 days.

(21) Appl. No.: 19/004,235

(22) Filed: Dec. 28, 2024

(65) Prior Publication Data

US 2026/0186554 A1 Jul. 2, 2026

(51) Int. Cl.
*G06F 1/3234* (2019.01)
*G06F 12/1009* (2016.01)
*G11C 7/10* (2006.01)

(52) U.S. Cl.
CPC ........ *G06F 1/3275* (2013.01); *G06F 12/1009* (2013.01); *G11C 7/1072* (2013.01)

(58) Field of Classification Search
CPC .. G06F 1/3275; G06F 12/1009; G11C 7/1072
USPC .......................................................... 713/323
See application file for complete search history.

(56) References Cited

U.S. PATENT DOCUMENTS 8,838,935 B2 * 9/2014 Hinton .................. G06F 12/023 711/206
12,014,213 B2 * 6/2024 Arora .................... G06F 9/4418
2010/0049940 A1 * 2/2010 Ware ........................ G06F 12/10 711/E12.078

* cited by examiner

*Primary Examiner* — Brian T Misiura
(74) *Attorney, Agent, or Firm* — SMITH TEMPEL BLAHA LLC

(57) ABSTRACT

A method and system for providing memory functions during a low power mode of a portable computing device ("PCD") may include creating a main page table during a first state of the PCD in a main memory device of the PCD. The main memory device is operational during the first state. The method and system may also include creating a low power mode page table in a first low power memory device during the first state of the PCD. The method and system may also include placing the PCD into a second state such that the first low power memory device and the second low power memory device are operational while the main memory is inoperational during the second state. One or more memory requests may be processed during the second state by using the low power mode page table in the first low power memory device.

20 Claims, 7 Drawing Sheets

METHOD AND SYSTEM FOR SUPPORTING MEMORY FUNCTIONS DURING LOW POWER MODES OF A PORTABLE COMPUTING DEVICE (PCD)

DESCRIPTION OF THE RELATED ART

A computing device may include multiple processor-based subsystems. A computing device may be, for example, a portable computing device ("PCD"), such as a laptop or palmtop computer, a cellular telephone or smartphone, a portable digital assistant, a portable game console, etc. Still other types of PCDs may be included in automotive and Internet-of-Things ("IoT") applications.

PCDs are often powered by a limited power supply, such as, but not limited to, rechargeable batteries. Because of their limited power supply and when not "plugged-in" or coupled to an alternating current ("A/C") power supply, PCDs often support low power modes ("LPMs") to conserve the life/longevity of the limited power supply. During LPMs and in order to conserve power, a PCD may shut down several hardware and/or software components or place them in a low powered state where these components do not provide any functionality during this low powered state.

One hardware component that a PCD may limit/place in a low power state and/or shut down can include memory, such as Double Data Rate ("DDR") Synchronous Dynamic Random Access Memory ("SDRAM"). Such memory is often referred to as just "DDR" memory. By shutting down DDR memory during a LPM, a PCD may conserve significantly more power.

However, some subsystems ("SS") of the PCD that may be operational during LPMs may need some form of memory to support their LPM operations. For example, motion sensors within a PCD may need to be operational during a LPM to detect movement of the PCD.

Accordingly, it would be desirable to provide energy efficient memory functions for subsystems of a PCD which may remain operational during a low power mode ("LPM") when most other hardware and software components are not in use and not available to the operational subsystems.

SUMMARY OF THE DISCLOSURE

Systems, methods, computer program products, and other examples are disclosed for providing memory functions during a low power mode of a portable computing device ("PCD").

A method for providing memory functions during a low power mode of a portable computing device ("PCD") may include creating a main page table during a first state of the PCD in a main memory device of the PCD. The main memory device is operational during the first state. The method may also include creating a low power mode page table in a first low power memory device during the first state of the PCD. The method may further include storing low power mode data in a second low power memory device during the first state of the PCD.

The method may also include placing the PCD into a second state such that the first low power memory device and the second low power memory device are operational while the main memory is inoperational during the second state. And the method may also include processing one or more memory requests during the second state by using the low power mode page table in the first low power memory device to access the low power mode data stored in the second low power memory device.

A system for providing memory functions during a low power mode of a portable computing device ("PCD") may include a main memory device of the PCD storing a main page table. The main memory device is operational during a first state of the PCD. The system may also include a first low power memory device storing a low power mode page table. The system may further include a second low power memory device storing low power mode data.

The system may also include the PCD being placed into a second state such that the first low power memory device and the second low power memory device are operational while the main memory is inoperational during the second state. And the system may include a processor processing one or more memory requests by using the low power mode page table in the first low power memory device to access the low power mode data stored in the second low power memory device.

A computer program product includes a non-transitory computer usable medium having a computer readable program code embodied therein. The computer readable program code is adapted to be executed to implement a method for providing memory functions during a low power mode of a portable computing device ("PCD"). The code implementing the method may include creating a main page table in a main memory device of the PCD during a first state of the PCD. The main memory device is operational during the first state.

The code implementing the method may further include creating a low power mode page table in a first low power memory device during the first state of the PCD. Then, the code implementing the method may also include storing low power mode data in a second low power memory device during the first state of the PCD.

The code implementing the method may further include placing the PCD into a second state such that the first low power memory device and the second low power memory device are operational while the main memory is inoperational during the second state. And the code implementing the method may include processing one or more memory requests during the second state by using the low power mode page table in the first low power memory device to access the low power mode data stored in the second low power memory device.

These and other features and advantages will become apparent from the following description, drawings and claims.

BRIEF DESCRIPTION OF THE DRAWINGS

In the Figures, like reference numerals refer to like parts throughout the various views unless otherwise indicated.

DETAILED DESCRIPTION

Figure 1:
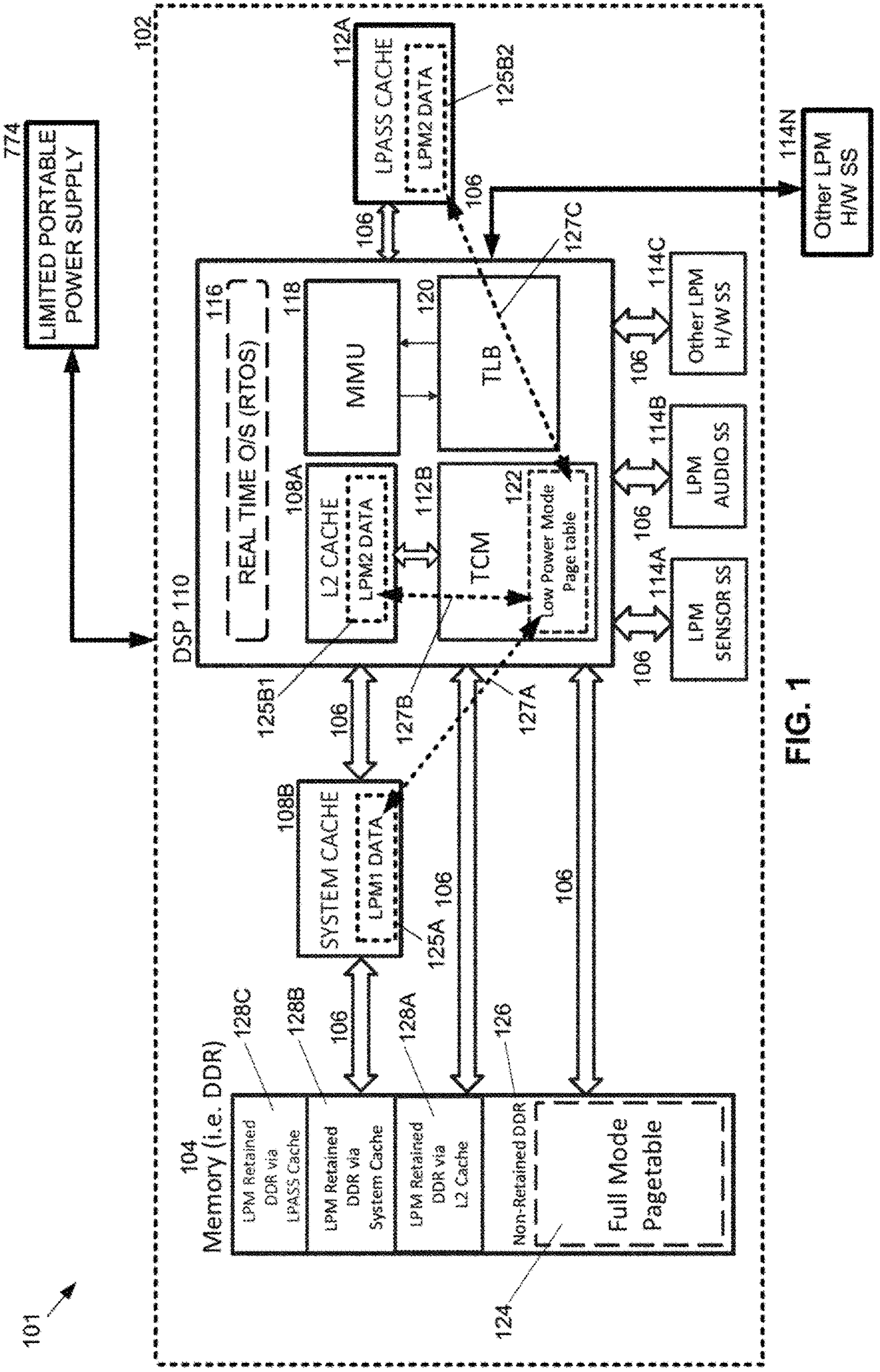
FIG. 1 illustrates a functional block diagram of a system in accordance with a representative embodiment for providing memory functions during a low power mode ("LPM") of a portable computing device.

In the following detailed description, for purposes of explanation and not limitation, exemplary, or representative, embodiments disclosing specific details are set forth in order to provide a thorough understanding of an embodiment according to the present teachings.

The word "exemplary" is used herein to mean "serving as an example, instance, or illustration." The words "illustrative" or "representative" may be used herein synonymously with "exemplary."

Any aspect described herein as "exemplary" is not necessarily to be construed as preferred or advantageous over other aspects. However, it will be apparent to one having ordinary skill in the art and having the benefit of the present disclosure that other embodiments according to the present teachings that depart from the specific details disclosed herein remain within the scope of the appended claims.

Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only and is not intended to be limiting. The defined terms are in addition to the technical and scientific meanings of the defined terms as commonly understood and accepted in the technical field of the present teachings.

As used in the specification and appended claims, the terms "a," "an," and "the" include both singular and plural referents, unless the context clearly dictates otherwise. Thus, for example, "a device" includes one device and plural devices.

Relative terms may be used to describe the various elements' relationships to one another, as illustrated in the accompanying drawings. These relative terms are intended to encompass different orientations of the device and/or elements in addition to the orientation depicted in the drawings.

It will be understood that when an element is referred to as being "connected to" or "coupled to" or "electrically coupled to" another element, it can be directly connected or coupled, or intervening elements may be present.

The term "memory device", as that term is used herein, is intended to denote a non-transitory computer-readable storage medium that is capable of storing computer instructions, or computer code, for execution by one or more processors. References herein to a "memory device" should be interpreted as including one or more memory devices.

A "processor", as that term is used herein, encompasses an electronic component that carries out tasks in hardware, software, and/or firmware. For example, a processor can be an electronic component that is programmed to execute a computer program or executable computer instructions.

A processor can also be an electronic component comprising one or more state machines. A processor may be a multi-core processor comprising multiple processing cores. A processor may also refer to a collection of processors within a single system or distributed amongst multiple systems. A processor could also refer to a digital signal processor ("DSP").

A "controller", as that term is used herein, can mean, for example, a processor, such as a multi-core microprocessor, a microcontroller, or a DSP.

The term "logic", as that term is used herein, means circuitry that is programmed or configured by software and/or firmware to perform particular operations. For example, logic gates of logic arrays, state machines or processors are examples of "logic", as that term is used herein. The term "circuit" or "circuitry", as those terms are used herein, denote electrical circuitry comprising analog and/or discrete circuit elements or components.

A portable computing device ("PCD") may include a laptop or palmtop computer, a cellular telephone or smartphone, a personal digital assistant ("PDA"), a navigation device, a smartbook, a portable game console, a satellite telephone, an automotive device, and an Internet-of-Things (IoT) device, etc. Each PCD is generally powered by a limited power supply. The limited power supply may comprise one or more rechargeable batteries. Other limited power supplies include capacitors and/or batteries combined with capacitors as understood by one of ordinary skill in the art.

Figure 7:
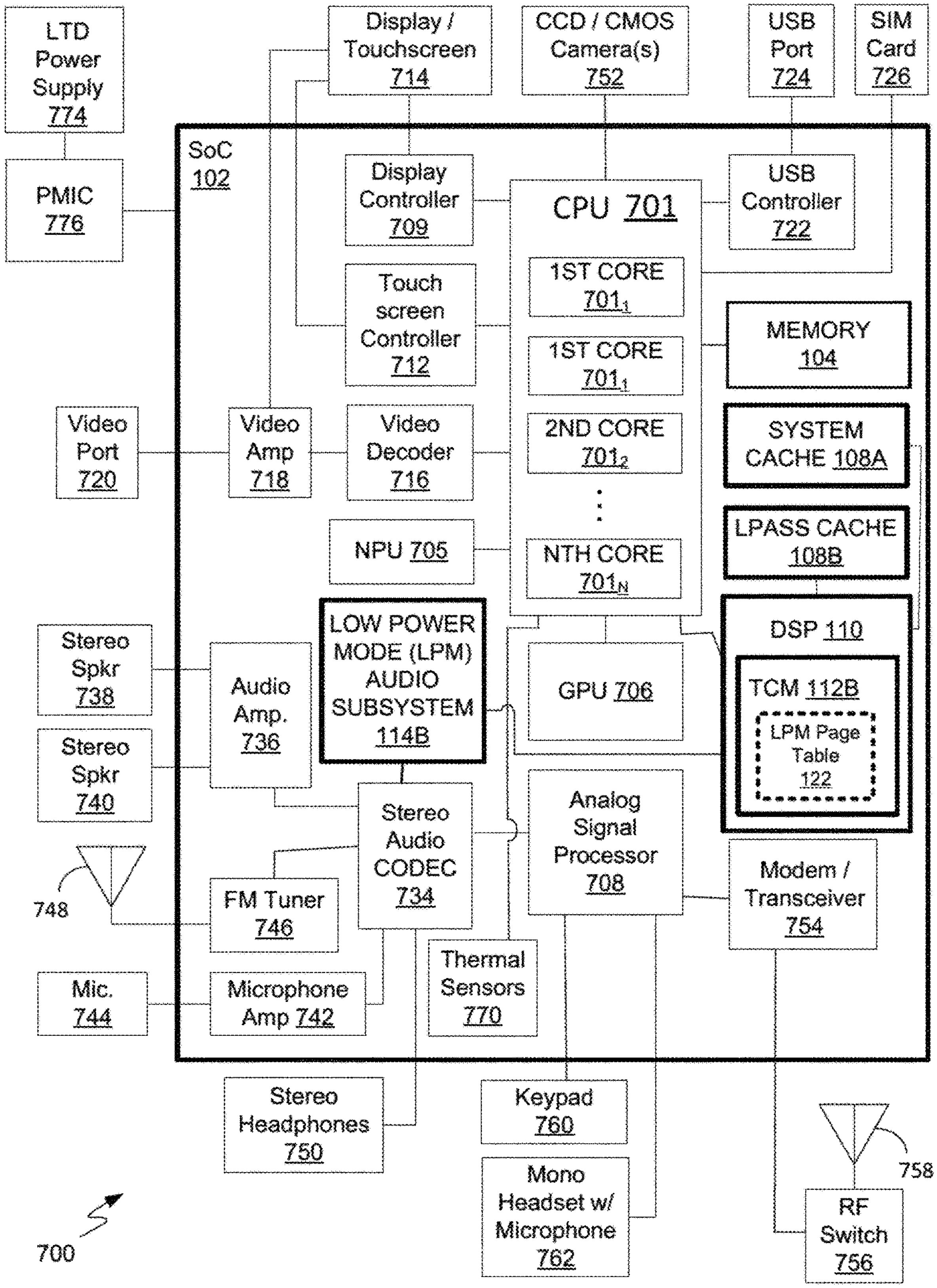
FIG. 7 illustrates an example of a portable computing device ("PCD") in which exemplary embodiments of systems, methods, computer-readable media, and other examples of the inventive principles and concepts of the present disclosure may be implemented.

Referring now to FIG. 1, this figure illustrates a functional block diagram of a system 101 in accordance with a representative embodiment for providing memory functions during a low power mode ("LPM") of a portable computing device ("PCD") 700 (see FIG. 7). The system 101 may include a "main" memory device 104; one or more buses 106; a system cache 108B; and a processor 110.

The system 101 may further include a low powered audio subsystem ("LPASS") tightly coupled memory ("TCM") 112A; a low powered mode ("LPM") sensor subsystem ("SS") 114A; a LPM audio subsystem ("SS") 114B; and other LPM hardware ("H/W") subsystems (SS) 114C. All of these elements of system 101 may reside on a System-on-Chip ("SoC") 102 as understood by one of ordinary skill in the art.

Meanwhile, other LPM H/W subsystems 114N, where N is an integer, as well as a limited portable power supply 774 may reside off-chip or outside of the SoC 102 as shown in FIG. 1. The limited portable power supply 774 may comprise one or more rechargeable batteries. However, the limited portable power supply 774 may also include capacitors, and/or rechargeable batteries combined with capacitors as understood by one of ordinary skill in the art.

Referring back to the SoC 102 of system 101, the main memory device 104 may be coupled to the system cache 108B via a bus 106. The system cache 108B may be coupled to the processor 110 via bus 106. The main memory device 104 may comprise volatile memory, such as, but not limited to, Double Data Rate ("DDR") Synchronous Dynamic Random Access Memory ("SDRAM"). Other volatile memory may include static random access memory ("SRAM").

However, other memory types beside volatile are possible for the memory device 104 and are included within the scope of this disclosure. Thus, the main memory device 104 may also comprise non-volatile memory or a combination of volatile and non-volatile memory.

During lower power modes ("LPMs") of the system 101 that is housed in a PCD 700 (see FIG. 7) and having a limited portable power supply 774, access to the memory device 104 may be extremely limited or cut-off, especially if the memory device 104 is completely shut down during a low power mode ("LPM") or running/operating in a LPM itself. That is, during a LPM, access to the main memory device 104 and its data stored therein may not be possible by the LPM sensor SS 114A, LPM audio SS 114B, other LPM H/W SS 114C, and/or the other off-chip LPM H/W SS 114N.

The processor 110 illustrated in FIG. 1 may comprise a digital signal processor ("DSP") 110. The DSP 110 may include a memory management unit ("MMU") 118 that is coupled to a translation lookaside buffer ("TLB") 120. As understood by one of ordinary skill in the art, the TLB 120 is a memory device that may store recent translations of a virtual memory to a physical memory.

The DSP 110 may further include a level 2 ("L2") cache 108A in addition to tightly coupled memory ("TCM") 112B. Each TCM 112 may comprise random access memory ("RAM") or any other type of volatile or even non-volatile memory as understood by one of ordinary skill in the art. The TCM 112 may provide low-latency memory access for the DSP 110 without the unpredictability of access time that is a feature of conventional cache type memory.

Notably, the TCM 112B that is part of the DSP 110 stores a low power mode ("LPM") page table 122. The LPM page table 122 will provide access to memories such as the system cache 108B, LPASS TCM 112A, and L2 Cache 108A when the main memory device 104 and its full mode page table 124 are not accessible during a LPM.

The LPM page table 122 in TCM 112B, as indicated by arrows 127A-127C, provides a mapping to low powered mode ("LPM") data 125. This LPM data 125 may be stored in the system cache 108B, the L2 cache 108A, and LPASS cache 112A during low power modes ("LPMs").

As will be explained in further detail below, low power modes ("LPMs") may be assigned categories or types. And depending on a LPM type, low power mode ("LPM") data for a particular type may be stored on a single memory device or a plurality of memory devices.

In the exemplary embodiment illustrated in FIG. 1, two low power mode types are provided: a first low power mode type 1 ("LPM1"); and a second low power mode type 2 ("LPM2"). However, fewer or a greater number of LPMs are possible and are included within the scope of this disclosure as understood by one of ordinary skill in the art.

As illustrated in FIG. 1, data 125A for the first LPM1 may be stored in a single memory device in the system cache 108B and accessed there during a low power mode of the PCD 700. Meanwhile, data 125B1 & 125B2 for the second LPM2 may be stored on two memory devices: in the L2 cache 108A where data 125B1 is stored, and in the LPASS cache 112A where data 125B2 is stored. The data 125B1 & 125B2 for the second LPM2 may be accessed during a low power mode of the PCD 700, like that of the first LPM1.

The low power mode ("LPM") page table 122 provides a mapping for the data 125 according to its LPM type (i.e. either LPM1 or either LPM2). And with this mapping and during a low power mode ("LPM") when the main memory 104 is shut-off/in a low power mode/or in a self-refresh state, each low power mode subsystem (LPM SS) 114 may access the LPM data 125 where the MMU 118 will access the LPM page table 122 stored within the TCM 112B and send memory requests to retrieve that data for each LPM SS 114 from the three memory devices—system cache 108B, L2 cache 108A, and LPASS cache 112A. The system cache 108B, L2 cache 108A, and LPASS cache 112A are functional/operational during a LPM, opposite to that of the main memory device 104 (which is not accessible/functional during most or all LPMs).

The main memory device 104 stores a full mode/operational mode page table 124 that is used when the PCD 700 and system 101 are not in a low power mode ("LPM"). As understood by one of ordinary skill in the art, the full mode page table 124 of memory device 104 is one key component of virtual address translation that is necessary to access data in the memory device 104.

The full mode page table 124 of memory device 104 may be set up by the operating system 116 of the DSP 110. The full mode page table 124 may be read from and written to during the virtual address translation process by the memory management unit ("MMU") 118 using its TLB 120.

Notably, the operating system 116 of the DSP 110 comprises a real time operating system ("RTOS") 116. The RTOS 116 is generally different than a "normal" or a general purpose operating system ("GPOS"), such as the APPLE™ iOS™ general purpose operating system, the WINDOWS™ general purpose operating system, and the ANDROID™ general purpose operating system. A RTOS 116 may include a root process domain 116A and kernel 116B (not shown in in FIG. 1, but see FIG. 2).

One important aspect of the kernel 116B of the RTOS 116 is it prioritizes most threads or tasks. Based on this priority, the kernel 116B serves a highest-priority process or thread first where the highest priority thread cannot be interrupted or preempted by another lower priority thread/request. Meanwhile, according to "normal" or general purpose operating systems, a request from within a kernel, such as that from a driver or a system service, may override all other processes and threads being served by the kernel.

With the RTOS 116, only very important service requests are usually kept within the kernel call and all other service requests are generally treated as external processes and threads. The kernel-based service requests are generally associated with the bounded latency of the RTOS 116 to maintain fast and predictable responses.

Referring back to FIG. 1, the system 101 may include a LPM sensor SS 114A. The LPM sensor SS 114A may comprise one or more sensors. Exemplary sensors for a PCD 700 may include, but are not limited to, accelerometers, gyroscopes, proximity sensors (i.e. infrared light sensors), ambient light sensors, air humidity sensors, barometer sensors, fingerprint sensors, magnetometer, Near-Field-Coupling (NFC) sensors, and pedometer sensors.

Such sensors may be used by the DSP 110 to determine if the system 101 and PCD 700 should exit from a low power mode ("LPM"). Other uses for the sensors during an LPM are possible and are included within the scope of this disclosure. These sensor subsystems 114A illustrated in FIG. 1 will generally operate during a LPM.

The second LPM audio subsystem ("SS") 114B may comprise a microphone 644 and/or speakers 738, 740 (see FIG. 7). The LPM audio SS 114B may also operate during a LPM. The LPM audio SS 114B may also be used by the DSP 110 to "awaken" the PCD 700 out of a LPM, such as when an operator of the PCD 700 provides an audible/spoken command.

However, other uses LPM audio SS 114B, beside awaking the PCD 700, are possible and are included within the scope of this disclosure. The system 101 may include other LPM hardware ("H/W") SS 114C as well as other additional LPM H/W subsystems 114N, where N is an integer. Other LPM H/W 114N may include, but is not limited to, cameras, pulse-ox detectors, and other devices.

The memory device 104 may include LPM retained regions 128A-128C. These retained regions correspond to the system cache 108B, the L2 cache 108A, and the LPASS TCM 112A. Specifically, LPM retained region 128A within the memory device 104 may contain data for the L2 cache 108A and transfer this data to the L2 cache 108A when the memory device 104 is about to collapse/shift and enter into a LPM.

Similarly, LPM retained region 128B within the memory device 104 may contain data for the system cache 108B and transfer this data to the system cache 108B when the memory device 104 is about to collapse and enter into a LPM. And lastly, LPM retained region 128C within the memory device 104 may contain data for the LPASS TCM 112A and transfer this data to the LPASS TCM 112A when the memory device 104 is about to collapse/shut-down/and enter into a LPM.

And the non-retained (i.e. "full mode-full power mode") region of the memory device 104 may contain the full mode page table 124 that is only operational during a full mode/full power mode. When the memory device 104 enters into a low power mode ("LPM")(which opposite to a full power mode), then the non-retained region 126, which may include the full mode page table 124, will not be accessible by any component within the system 101 as illustrated in FIG. 1.

Figure 2:
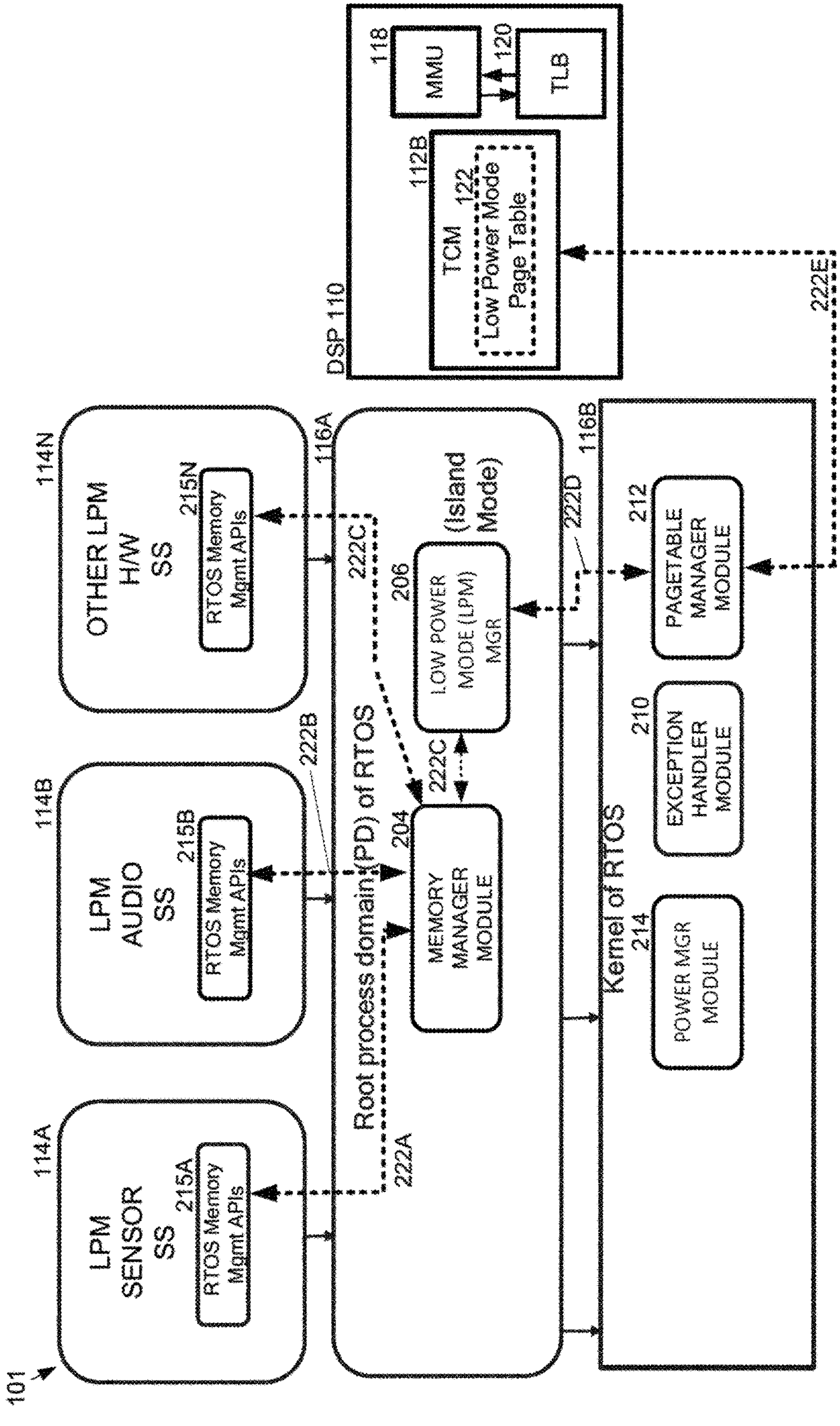
FIG. 2 illustrates a functional block diagram of several software ("S/W") elements of the real time operating system ("RTOS") executed by the digital signal processor ("DSP") and which help provide access to the low power mode ("LPM") page table stored in the tightly coupled memory of the digital signal processor of FIG. 1.

Referring now to FIG. 2, this figure illustrates a functional block diagram of several software ("S/W") elements of the real time operating system ("RTOS") 116 executed by the digital signal processor ("DSP") 116 and which help provide access to the low power mode ("LPM") page table stored in TCM 112B of the DSP 110 of FIG. 1. The RTOS 116 may comprise a root process domain 116A and a kernel 116B. The root process domain 116A may include a memory manager module 204 and a low power mode ("LPM") manager 206.

Meanwhile, the kernel 116B of the RTOS 116 may include a power manager module 214; an exception handler module 210; and a page table manger module 212. The power manager module 214 may send signals to the H/W elements of FIG. 1 when a LPM is about to be started for the PCD 700.

The exception handler module 210 may manage exceptions when each low power mode ("LPM") subsystem ("SS") 114 attempts to access the LPM data 125 stored in the three memory devices 108A, 108B, and 112A. As noted above, the three memory devices 108A, 108B, and 112A are operational when the main memory device 104 is not accessible during the LPM.

The page table manager module 212 of the kernel 116B will work with the low power mode ("LPM") manager 206 along with the memory manager module 204 of the root process domain 116A to create the low power mode ("LPM") page table 122 stored in the TCM 112B of the DSP 110. Dashed signal lines 222A-222E denote how these system elements work together to create the LPM page table 122.

Creation of the LPM page table 122 will be described in more detail below in connection with the signal diagrams of FIGS. 3-5. Meanwhile, each of the LPM sensor SS 114A, LPM Audio SS 114B, and other LPM H/W SS 114N may communicate with the root process domain 116A of the RTOS 116 via memory management application programming interfaces (APIs) 215A, 215B, & 215N as understood by one of ordinary skill in the art.

Figure 3:
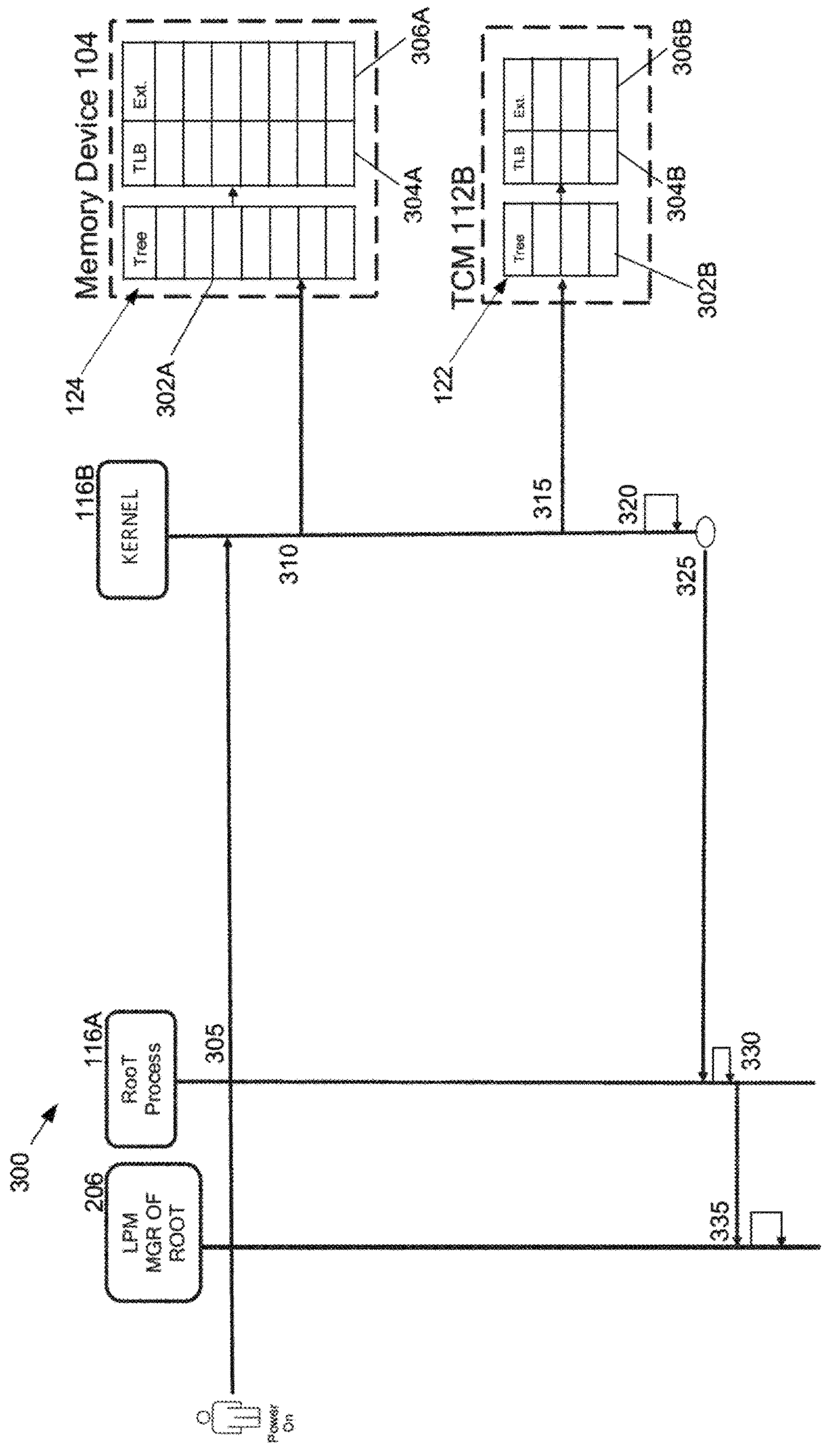
FIG. 3 is a signaling sequence diagram illustrating page table initialization for both the full mode page table in the memory device of FIG. 1 and the low power mode page table in the tightly coupled memory ("TCM") of the digital signal processor of FIG. 1 in accordance with exemplary embodiments.

Referring now to FIG. 3, this figure is a signaling sequence diagram illustrating page table initialization 300 for both the full mode page table 124 in the memory device 104 of FIG. 1 and the low power mode page table 122 in the TCM 112B of the DSP 110 of FIG. 1 in accordance with exemplary embodiments. When the PCD is powered on (305) in a full power mode (i.e. not in a low power mode), this causes the kernel 116B of the RTOS to initialize/create (310) the full mode page table 124 that is stored in the memory device 104 shown in FIG. 1.

The full mode page table 124 has a tree section/column 302A as well as a translation lookaside buffer ("TLB") section/column 304A. The full mode page table 124 also has an extension column/section 306A as these three sections of the full mode page table are understood to one of ordinary skill in the art.

Then the kernel 116B will initialize/create (315) a low power mode page table 122 in the TCM 112B of the DSP 110 of FIG. 1 when one or more low power mode ("LPM") subsystems 114 communicate to the kernel 116 that each is present and ready to support a low power mode for the PCD 700. Similar to the full mode page table 124, the LPM page table 122 in the TCM 112B has the three sections: tree section 302B; a TLB section 304B; and extension section 306B.

The extension section 306B will identify the type of low power mode ("LPM"). According to one exemplary embodiment, the system 101 may support two types of LPMs as described above: a first low power mode 1 ("LPM1); and a second low power mode 2 ("LPM2).

However, the system may support fewer or a greater number of LPMs which are included within the scope of this disclosure. Thus, the extension section 306B of the LPM page table 122 will usually identify a type of LPM for each page table entry ("PTE").

The LPM page table 122 will provide a mapping to the physical memory locations within the system cache 108B, the L2 cache 108A, and the LPASS Cache 112A where LPM data 125 will be stored. This mapping function for the LPM page table 122 will be described in further detail below. As noted above, during a low power mode ("LPM"), access to the main memory device 104 will be cut-off/shut down in order to conserve power for the PCD 700, where the PCD 700 is powered by a limited ("LTD") power supply 774 (i.e. battery).

Referring back to FIG. 3, after initialization of the LPM page table 122 (315), then the kernel 116B spawns (320-325) the root process domain 116A. Next, the root process domain 116A may compile/logs (330) the different types of LPMs (i.e. LPM1, LPM2) that will be supported by the system 100 and each LPM's memory requirements. The root process domain 116A will then spawn/create (335) the LPM manager 206 and pass along the LPM types and memory requirements to the LPM manager 206 of FIG. 2.

Figure 4:
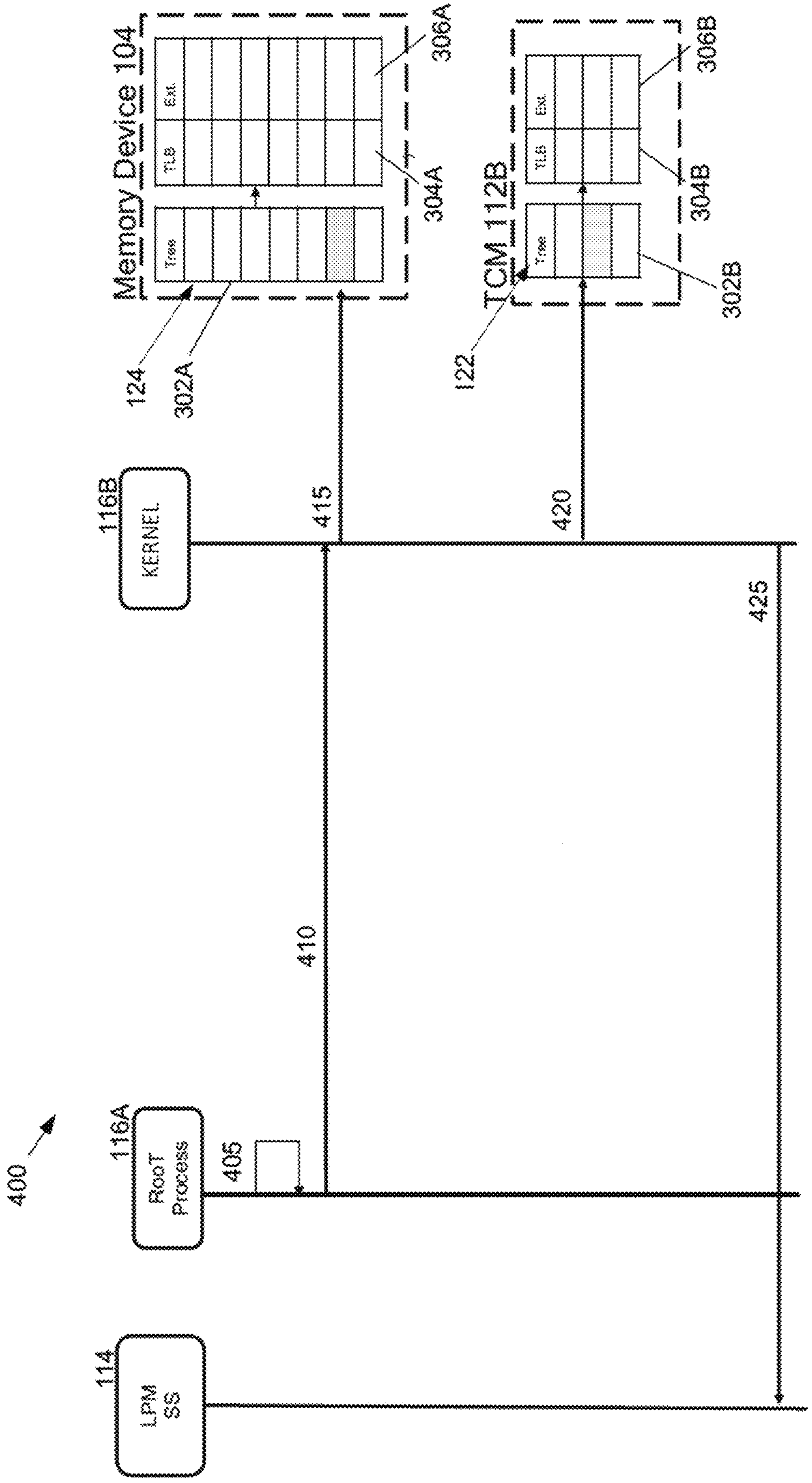
FIG. 4 is a signaling sequence diagram illustrating how low power modes for each LPM subsystem of FIGS. 1-2 are created/spawned in accordance with exemplary embodiments.

Referring now to FIG. 4, this figure is a signaling sequence diagram illustrating how low power mode processes for each LPM subsystem 114 of FIGS. 1-2 are created/spawned in accordance with exemplary embodiments. The root process domain 116A will spawn/create (405) a process to support each LPM subsystem 114 in response to a LPM subsystem 114 advising the root process domain 116A that it may operate in an LPM. Then the root process domain 116A will request (410) the kernel 116A via the page table manager module 212 to allocate a page table entry (PTE) for each process in the full mode page table 124 in memory device 104.

Then, if one or more LPMs were determined in FIG. 3 during page table initialization (300), then the kernel 116A via the page table manager module 212 will also allocate (420) a page table entry (PTE) for each LPM process in the LPM page table 122 in the TCM 112B. The kernel 116 may then set the start-up entry point (425) for the user process domain along with other control registers and execute a return from exception. The hardware will then start to execute start-up code in a user mode.

Figure 5:
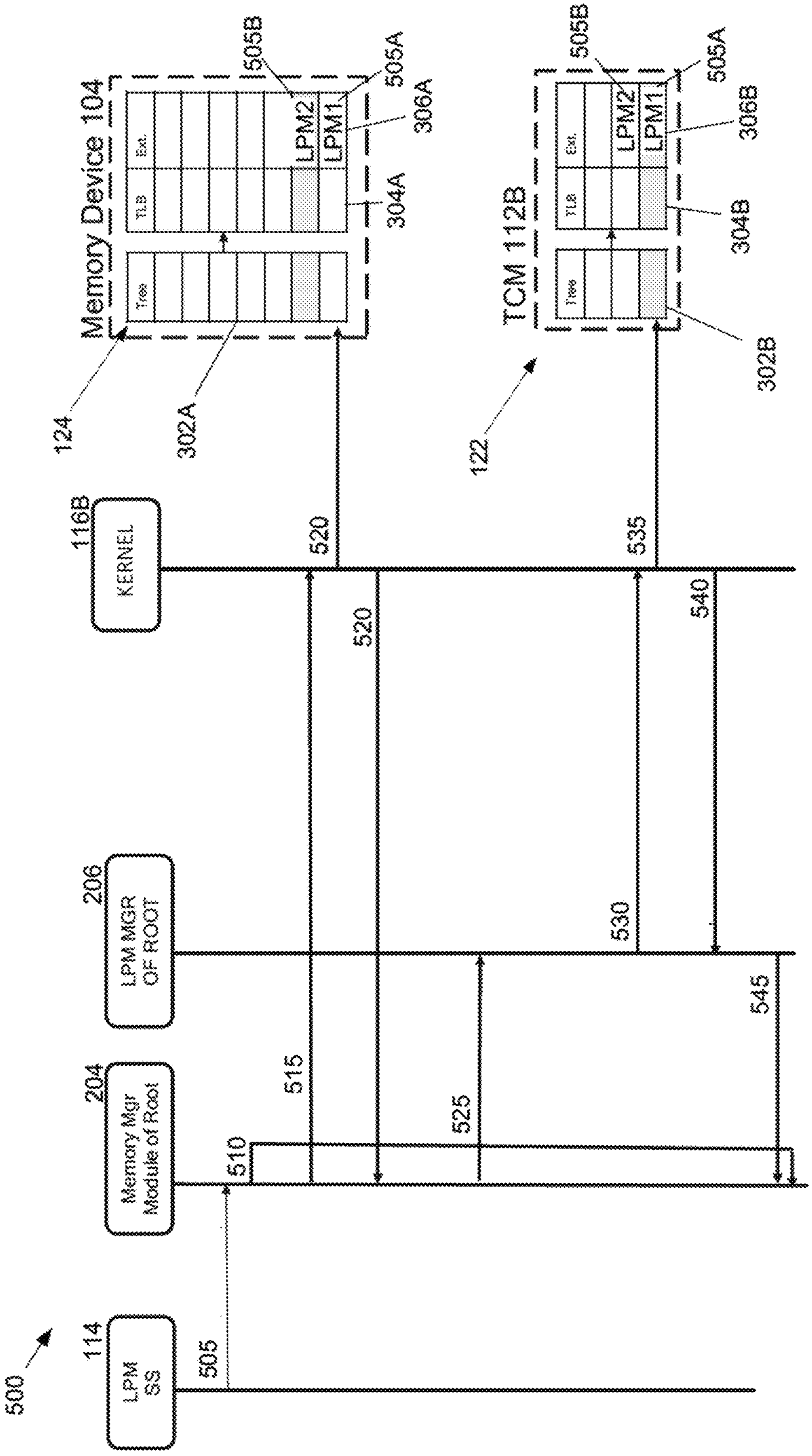
FIG. 5 is a signaling sequence diagram illustrating memory mapping operations for the full mode page table of the main memory device and the low power mode page table in the tightly coupled memory of the digital signal processor of FIG. 1 in accordance with exemplary embodiments.

Referring now to FIG. 5, this figure is a signaling sequence diagram 500 illustrating memory mapping operations for the full mode page table 124 of the main memory device 104 and the low power mode page table 122 in the tightly coupled memory 112B of the digital signal processor 110 of FIG. 1 in accordance with exemplary embodiments;

One or more LPM subsystems 114 will request (505) the memory manger 204 of the root process domain 116A to secure/create a memory mapping for each respective LPM mode while the PCD 700 is operating in a full mode (i.e. "full power"). The LPM subsystem 114 will relay attributes/characteristics about this LPM mode that may include, but are not limited to: a virtual address, a physical address, physical memory size needed, and if the LPM is cacheable, etc., etc.

Next, the memory manager 204 of the root process domain 116A will start a loop (510) break the memory request into page boundaries. The memory manager 204 will break up the memory request based on the size of the memory hardware (i.e. 16K memory size, 64K memory, 128K memory size, etc.).

Subsequently, the memory manager module 204 will send (515) a request to the kernel 116B, and specifically the page table manager module 212 of the kernel 116B, to create a page table entry ("PTE") in the full mode page table 124. Next, the page table manager module 212 of the kernel 116B will allocate a PTE for the LPM mode memory request in the full mode page table 124 in main memory device 104.

This PTE in the full mode page table 124 will also include the type of low power mode ("LPM") where this information on LPM type will be placed in the extension section 306A. For the exemplary embodiment illustrated in FIG. 5, there are two LPMs: LPM1 (505A) and LPM2 (505B). As noted previously, fewer or greater LPMs are possible and are included within the scope of this disclosure.

During 520, the kernel 116B will also create the retained sections 128 of the main memory device 104 (which correspond to the system cache 108B, L2 cache 108A, and LPASS cache 112A) depending upon the LPM type indicated in the extension section 306A (i.e. LPM1 505A or LPM2 505B, etc.). Specifically, the LPM manager 206 may store the LPM data 125 for each LPM type in the main memory device 104 during full power mode (i.e. "full power" and outside of a LPM mode).

That is, the LPM manager will store LPM1 type data 125A destined for the system cache 108B in the retained section 128B of the memory device 104. Similarly, the LPM manager 206 will store the LPM2 type data destined for the L2 cache 108A in the retained section 128A of the memory device 104. And the LPM manager 206 will store LPM2 data 125 destined for the LPASS cache 112A in the retained section 128C of the memory device 104.

After this PTE creation (520) & retained memory section creation (520) in the main memory device 104 by the page table manager module 212 of the kernel 116B, the page table manager module 212 will indicate (520) if the PTE creation (520) was successful or not.

Next, if a PTE of the full mode page table 124 contains an LPM mode with an LPM type 505, then the memory manager 204 of the root process domain 116A will send a request (525) to the LPM manager 206 of the root process domain 116A to determine if any retained memory sections 128 within the memory device 104 have been formed for respective LPMs (i.e. LPM1 505A; LPM2 505B, etc.).

And if any retained memory sections 128 have been formed, then the LPM manager 206 of the root process domain 116A will send a request to the page table manger module 212 to create a PTE in the LPM page table 122 in the TCM 112B for a respective LPM 505 (i.e. LPM1 505A; LPM2 505B; etc.) that has a LPM retained section 128 in the main memory device 104. The PTE in the LPM page table 122, like the full mode page table 124, will also have an extension section 306B to store the LPM types (i.e. LPM1 505A; LPM2 505B, etc.).

If the PTE creation (535) is successful, then the page table manager 212 will send (540) a success message to the LPM manager 206 of the root process domain 116A. The LPM manager 206 will then relay this success message (545) to the memory manager 204 of the root process domain 116A.

Figure 6:
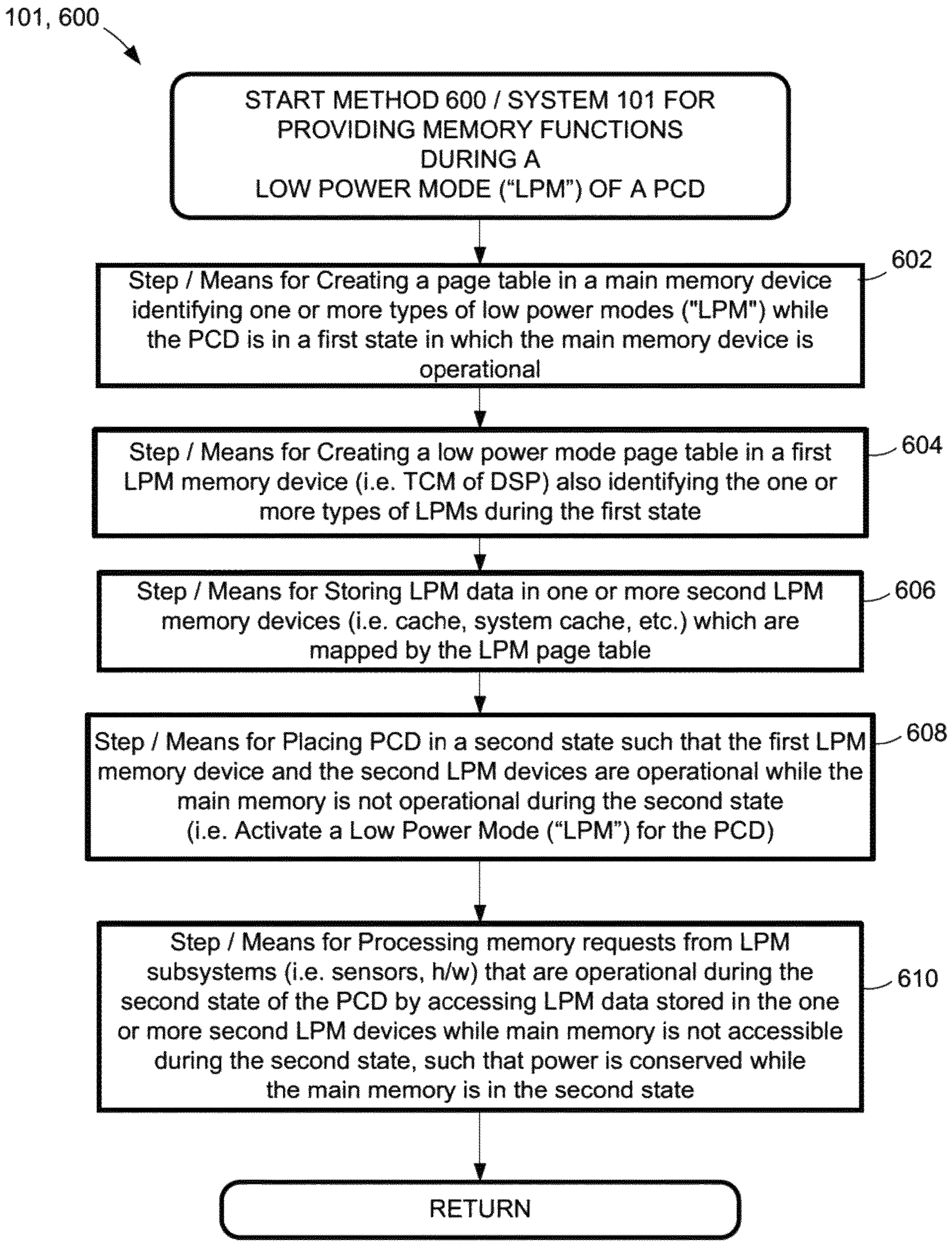
FIG. 6 illustrates a logical flow chart for a method and the system for providing memory functions during a lower power mode ("LPM") of the portable computing device ("PCD") illustrated in FIG. 7.

Referring now to FIG. 6, this figure illustrates a logical flow chart for a method 600 and the system 101 for providing memory functions during a lower power mode ("LPM") of a PCD 700. Block 602 is the first block for the method 600 and system 101.

As indicated by block 602, the method 600 and system 101 may include creating or a means for creating a first page table 124 in a main memory device 104 that identifies one or more types of low power modes ("LPMs") LPM1 505A, LPM2 505B, etc. (as shown in FIG. 5) while the PCD 700 is in a first state in which the main memory device 104 is operational. The first state may correspond to a "full-power" mode of the PCT 700 in which most or all H/W and S/W elements are fully operational.

This first state is opposite to any LPM (referenced as the "second state" described below). The creating of the first page table 124 may be performed by page table manager module 212 of the kernel 116B as described above.

Next, a indicated by block 604, the method 600 and system 101 may also include creating or a means for creating a low power mode ("LPM") page table 122 in a first LPM memory device 112B (i.e. the TCM 112B of the DSP 110 of FIG. 1), where this LPM page table 122 also identifies one or more types of low power modes ("LPMs") LPM1 505A, LPM2 505B, etc. (as illustrated in FIG. 5.) during this first state of the PCD 700. The creating of the low power mode page table 122 may be performed by the low power mode manager 206 of the root process domain 116A as well as the page table manager 212 of the kernel 116B described above.

Subsequently, as shown by block 606 of FIG. 6, the method 600 and system 101 may include storing or a means for storing low power mode ("LPM") data 125 in one or more second LPM memory devices 108A, 108B, 112A (i.e. L2 cache 108A, system cache 108B, and LPASS cache 112A of FIG. 1 containing LPM data 125) which are mapped by/referenced by the LPM page table 122 stored in the first LPM memory device 112B.

This storing of LPM data 125 in one or more second LPM memory devices 108A, 108B, 112A may be performed by the LPM manager 206 and kernel 116B during signal flows 535-540 of FIG. 5 described previously in which the data of the retained memory regions 128 in the main memory device 104 may be transferred over as the LPM data 125 to the second LPM memory devices 108A, 108B, 112A.

Next, as indicated by block 608, the method 600 and system 101 may include placing or a means for placing the PCD 700 into a second state (i.e. a low power mode) such that the first LPM memory device 112B and the one or more second memory devices 108A, 108B, 112A remain operation while the main memory device 104 is not operational (i.e. "inoperational") and/or does not support memory functions/requests for other elements of the system 101 during this second state.

This block 608 may also be referred to as activating a low power mode for the PCD 700. The placing of the PCD 700 in the low power state or second state may be performed by the power manager module 214 of the kernel 116B as illustrated in FIG. 1.

Next, as shown by block 610, the method 600 and system 101 may include processing or means for processing memory requests from one or more LPM subsystems 114 that are operational during the second state (i.e. low power mode) of the PCD 700 by accessing the LPM data 125 stored in the one or more second LPM memory devices 108A, 108B, 112A.

During this second state, the main memory 104 and its full mode page table 124 are not accessible by any components/elements of the system 101. By making the main memory 104 not operational (i.e. "inoperational") during this second date (i.e. low power mode), then power is conserved as understood by one of ordinary skill in the art.

This processing of memory requests during the second state in block 610 may be performed by the MMU 118 accessing the LPM page table 122 in the TCM 112B of DSP 110 and retrieving the LPM data 125 from the second LPM memory devices 108A, 108B, 112A. The method 600 then returns after block 610.

Referring now to FIG. 7, this figure illustrates an example of a portable computing device (PCD) 700 that may include, but is not limited to, a laptop or palmtop computer, a cellular telephone or smartphone, a personal digital assistant (PDA), a navigation device, a smartbook; a portable game console including an Extended Reality (XR) device, a Virtual Reality (VR) device, an Augmented Reality (AR) device, or a Mixed Reality (MR) device; a satellite telephone, an automotive device, an Internet-of-Things (IoT) device, etc.

The PCD 600 may include exemplary embodiments of systems, methods, computer-readable media, and other examples of the inventive principles and concepts of the present disclosure. The PCD 700 is generally powered by a limited ("LTD") power supply 774. The limited power supply 774 may comprise one or more rechargeable batteries.

However, the limited portable power supply 774 may also include capacitors, and/or rechargeable batteries combined with capacitors as understood by one of ordinary skill in the art. The power supply 774 and a power management integrated circuit (PMIC) 776 may supply power to the SoC 102.

The SoC 102 of PCD 700 may include the system 101 shown in FIG. 1. For purposes of clarity, some elements of system 101 as well as system interconnects, signals, etc., are not shown in FIG. 7.

The SoC 102 may include a central processing unit ("CPU") 701, a neural processing unit ("NPU") 705, a graphical processing unit ("GPU") 706, the digital signal processor ("DSP") 110 of FIG. 1, an analog signal processor 708, a modem/transceiver 754, and/or other processors. The CPU 701 may include one or more CPU cores, such as a first CPU core $701_1$, a second CPU core $701_2$, etc., through an $M^{th}$ CPU $cor_M$ $701_M$.

The CPU 701 as well as the DSP 110 may also include cache memory. The cache memory comprises level 1 (L1) and/or level 2 (L2) cache memory 108A (see FIG. 1 for cache memory 108A of the DSP 110). Notably, the DSP 110 of FIG. 7 further includes tightly coupled memory 112B that stores the Low Power Mode ("LPM") page table 122 described above. The DSP 110 may also be coupled to a low power mode ("LPM") audio subsystem 114B.

A display controller 709 and a touch-screen controller 712 may be coupled to the CPU 701. A touchscreen display 714 external to the SoC 101 may be coupled to the display controller 709 and the touch-screen controller 712. The PCD 700 may further include a video decoder 716 coupled to the CPU 701. A video amplifier 718 may be coupled to the video decoder 716 and the touchscreen display 714. A video port 720 may be coupled to the video amplifier 718.

A universal serial bus ("USB") controller 722 may also be coupled to CPU 701, and a USB port 724 may be coupled to the USB controller 722. A subscriber identity module ("SIM") card 726 may also be coupled to the CPU 701.

One or more memories, such as main memory 104 (see also FIG. 1), may be coupled to the CPU 701 and the DSP 110. The one or more memories may include both volatile and non-volatile memories. Examples of volatile memories include static random-access memory ("SRAM") and dynamic random access memory ("DRAM"). The one or more memories may include the LPASS cache 108B and the system-level cache memory 108A, as well as level 3 (L3) cache memory (not shown).

A stereo audio CODEC 734 may be coupled to the analog signal processor 708. An audio amplifier 736 may be coupled to the stereo audio CODEC 734. The CODEC 734 may be coupled to the LPM audio subsystem 114B. Meanwhile, first and second stereo speakers 738 and 740, respectively, may be coupled to the audio amplifier 736. A microphone amplifier 742 may be coupled to the stereo audio CODEC 734, and a microphone 744 may be coupled to the microphone amplifier 742. A frequency modulation ("FM") radio tuner 746 may be coupled to the stereo audio CODEC 734. An FM antenna 748 may be coupled to the FM radio tuner 746. Further, stereo headphones 750 may be coupled to the stereo audio CODEC 734. Other devices that may be coupled to the CPU 701 include one or more digital (e.g., CCD or CMOS) cameras 752.

The modem or RF transceiver 754 may be coupled to the analog signal processor 708 and to the CPU 701. An RF switch 756 may be coupled to the RF transceiver 754 and to an RF antenna 758. In addition, a keypad 760 and a mono headset with a microphone 762 may be coupled to the analog signal processor 708. The SoC 101 may have one or more internal or on-chip thermal sensors 770.

Firmware or software may be stored in any of the above-described memories, or may be stored in a local memory directly accessible by the processor hardware on which the software or firmware executes. Execution of such firmware or software that may comprise the real time operating system ("RTOS") 116 (see FIG. 1) and include the LPM manager module 206 (see FIG. 2) may control aspects of any of the above-described methods or configure aspects of any of the above-described systems.

Any such memory or other non-transitory storage medium having firmware or software stored therein in computer-readable form for execution by processor hardware may be an example of a "computer-readable medium," as the term is understood in the patent lexicon.

It should be noted that the process represented by the flow diagram shown in FIG. 6 may be modified or augmented in a number of ways within the scope of the present disclosure. That is, certain blocks/steps in the process/method 600 described above naturally precede others for the system 101 to function as described.

However, the method 600 and system 100 are not limited to the order of the steps described if such order or sequence does not alter the functionality of the system 100 and method 600. That is, it is recognized that some steps may be performed before, after, or parallel (substantially simultaneously with) other blocks/steps without departing from the scope of this disclosure. In some instances, certain blocks/steps may be omitted or not performed without departing from this disclosure as understood by one of ordinary skill in the art.

Further, words such as "thereafter", "then", "next", etc. are not intended to limit the order of the blocks/steps illustrated in FIG. 6. These words are simply used to guide the reader through the description of the exemplary method 600 with the understanding that the sequence of blocks/steps may be adjusted depending upon a particular application of the method 600 and/or system 101.

Implementation examples are described in the following numbered clauses:

1. A method for providing memory functions during a low power mode of a portable computing device ("PCD"), the method comprising:
   - during a first state of the PCD, creating a main page table in a main memory device of the PCD, the main memory device being operational during the first state;
   - during the first state of the PCD, creating a low power mode page table in a first low power memory device;
   - during the first state of the PCD, storing low power mode data in a second low power memory device;
   - placing the PCD into a second state such that the first low power memory device and the second low power memory device are operational while the main memory is inoperational during the second state; and
   - during the second state, processing one or more memory requests by using the low power mode page table in the first low power memory device to access the low power mode data stored in the second low power memory device.
2. The method of clause 1, further comprising generating the one or more memory requests from a low power subsystem, the low power subsystem comprising at least one of: accelerometer, gyroscope, proximity sensor, an ambient light sensor, air humidity sensor, a barometer sensor, a fingerprint sensor, a magnetometer, a Near-Field-Coupling (NFC) sensor, a pedometer, a microphone, a camera, and a pulse-ox detector.
3. The method of clauses 1-2, wherein the low power mode page table of the first low power mode memory device identifies one or more types of low power modes.
4. The method of clauses 1-3, wherein the main memory device comprises Synchronous Dynamic Random Access Memory ("SDRAM").
5. The method of clauses 1-4, wherein the first and second low power mode memory devices comprise at least one of: tightly coupled memory and cache memory.
6. The method of clauses 1-5, wherein the PCD has a limited power supply.
7. The method of clause 6, wherein the limited power supply comprises at least one of: one or more rechargeable batteries; one or more capacitors; or a combination thereof.
8. The method of clauses 1-7, wherein the PCD comprises at least one of:
   - a laptop or palmtop computer, a cellular telephone or smartphone, a personal digital assistant ("PDA"), a navigation device, a smartbook, a portable game console, a satellite telephone, an automotive device, and an Internet-of-Things (IoT) device.
9. A system for providing memory functions during a low power mode of a portable computing device ("PCD"), the system comprising:
   - a main memory device of the PCD storing a main page table, the main memory device being operational during a first state of the PCD;
   - a first low power memory device storing a low power mode page table;
   - a second low power memory device storing low power mode data;
   - the PCD being placed into a second state such that the first low power memory device and the second low power memory device are operational while the main memory is inoperational during the second state; and
   - a processor during the second state processing one or more memory requests by using the low power mode page table in the first low power memory device to access the low power mode data stored in the second low power memory device.
10. The system of clause 9, further comprising a low power subsystem that generates the one or more memory requests, the low power subsystem comprising at least one of: accelerometer, gyroscope, proximity sensor, an ambient light sensor, air humidity sensor, a barometer sensor, a fingerprint sensor, a magnetometer, a Near-Field-Coupling (NFC) sensor, a pedometer, a microphone, a camera, and a pulse-ox detector.
11. The system of clauses 9-10, wherein the low power mode page table of the first low power mode memory device identifies one or more types of low power modes.
12. The system of clauses 9-11, wherein the main memory device comprises Synchronous Dynamic Random Access Memory ("SDRAM").
13. The system of clauses 9-12, wherein the first and second low power mode memory devices comprise at least one of: tightly coupled memory and cache memory.
14. The system of clauses 9-13, wherein the PCD has a limited power supply.
15. The system of clause 14, wherein the limited power supply comprises at least one of: one or more rechargeable batteries; one or more capacitors; or a combination thereof.
16. The system of clauses 9-15, wherein the PCD comprises at least one of: a laptop or palmtop computer, a cellular telephone or smartphone, a personal digital assistant ("PDA"), a navigation device, a smartbook, a portable game console, a satellite telephone, an automotive device, and an Internet-of-Things (IoT) device.
17. A computer program product comprising a non-transitory computer usable medium having a computer readable program code embodied therein, said computer readable program code adapted to be executed to implement a method for providing memory functions during a low power mode of a portable computing device ("PCD"), said method comprising:

during a first state of the PCD, creating a main page table in a main memory device of the PCD, the main memory device being operational during the first state;

during the first state of the PCD, creating a low power mode page table in a first low power memory device;

during the first state of the PCD, storing low power mode data in a second low power memory device;

placing the PCD into a second state such that the first low power memory device and the second low power memory device are operational while the main memory is inoperational during the second state; and during the second state, processing one or more memory requests by using the low power mode page table in the first low power memory device to access the low power mode data stored in the second low power memory device.

18. The computer program product of clause 17, wherein the program code implementing the method further comprises generating the one or more memory requests from a low power subsystem, the low power subsystem comprising at least one of:

accelerometer, gyroscope, proximity sensor, an ambient light sensor, air humidity sensor, a barometer sensor, a fingerprint sensor, a magnetometer, a Near-Field-Coupling (NFC) sensor, a pedometer, a microphone, a camera, and a pulse-ox detector.

19. The computer program product of clauses 17-18, wherein the low power mode page table of the first low power mode memory device identifies one or more types of low power modes.

20. The computer program product of clauses 17-19, wherein the first and second low power mode memory devices comprise at least one of: tightly coupled memory and cache memory.

Alternative embodiments will become apparent to one of ordinary skill in the art to which the invention pertains in view of the present disclosure. Therefore, although selected aspects have been illustrated and described in detail, it will be understood that various substitutions and alterations may be made therein.

What is claimed is:

1. A method for providing memory functions during a low power mode of a portable computing device ("PCD"), the method comprising:

during a first state of the PCD, creating a main page table in a main memory device of the PCD, the main memory device being operational during the first state;

during the first state of the PCD, creating a low power mode page table in a first low power memory device;

during the first state of the PCD, storing low power mode data in a second low power memory device;

placing the PCD into a second state such that the first low power memory device and the second low power memory device are operational while the main memory is inoperational during the second state; and during the second state, processing one or more memory requests by using the low power mode page table in the first low power memory device to access the low power mode data stored in the second low power memory device.

2. The method of claim 1, further comprising generating the one or more memory requests from a low power subsystem, the low power subsystem comprising at least one of: accelerometer, gyroscope, proximity sensor, an ambient light sensor, air humidity sensor, a barometer sensor, a fingerprint sensor, a magnetometer, a Near-Field-Coupling (NFC) sensor, a pedometer, a microphone, a camera, and a pulse-ox detector.

3. The method of claim 1, wherein the low power mode page table of the first low power mode memory device identifies one or more types of low power modes.

4. The method of claim 1, wherein the main memory device comprises Synchronous Dynamic Random Access Memory ("SDRAM").

5. The method of claim 1, wherein the first and second low power mode memory devices comprise at least one of: tightly coupled memory and cache memory.

6. The method of claim 1, wherein the PCD has a limited power supply.

7. The method of claim 6, wherein the limited power supply comprises at least one of: one or more rechargeable batteries; one or more capacitors; or a combination thereof.

8. The method of claim 1, wherein the PCD comprises at least one of: a laptop or palmtop computer, a cellular telephone or smartphone, a personal digital assistant ("PDA"), a navigation device, a smartbook, a portable game console, a satellite telephone, an automotive device, and an Internet-of-Things (IoT) device.

9. A system for providing memory functions during a low power mode of a portable computing device ("PCD"), the system comprising:

a main memory device of the PCD storing a main page table, the main memory device being operational during a first state of the PCD;

a first low power memory device storing a low power mode page table;

a second low power memory device storing low power mode data;

the PCD being placed into a second state such that the first low power memory device and the second low power memory device are operational while the main memory is inoperational during the second state; and a processor during the second state processing one or more memory requests by using the low power mode page table in the first low power memory device to access the low power mode data stored in the second low power memory device.

10. The system of claim 9, further comprising a low power subsystem that generates the one or more memory requests, the low power subsystem comprising at least one of: accelerometer, gyroscope, proximity sensor, an ambient light sensor, air humidity sensor, a barometer sensor, a fingerprint sensor, a magnetometer, a Near-Field-Coupling (NFC) sensor, a pedometer, a microphone, a camera, and a pulse-ox detector.

11. The system of claim 9, wherein the low power mode page table of the first low power mode memory device identifies one or more types of low power modes.

12. The system of claim 9, wherein the main memory device comprises Synchronous Dynamic Random Access Memory ("SDRAM").

13. The system of claim 9, wherein the first and second low power mode memory devices comprise at least one of: tightly coupled memory and cache memory.

14. The system of claim 9, wherein the PCD has a limited power supply.

15. The system of claim 14, wherein the limited power supply comprises at least one of: one or more rechargeable batteries; one or more capacitors; or a combination thereof.

16. The system of claim 9, wherein the PCD comprises at least one of: a laptop or palmtop computer, a cellular telephone or smartphone, a personal digital assistant ("PDA"), a navigation device, a smartbook, a portable game console, a satellite telephone, an automotive device, and an Internet-of-Things (IOT) device.

17. A computer program product comprising a non-transitory computer usable medium having a computer readable program code embodied therein, said computer readable program code adapted to be executed to implement a method for providing memory functions during a low power mode of a portable computing device ("PCD"), said method comprising:

during a first state of the PCD, creating a main page table in a main memory device of the PCD, the main memory device being operational during the first state;

during the first state of the PCD, creating a low power mode page table in a first low power memory device;

during the first state of the PCD, storing low power mode data in a second low power memory device;

placing the PCD into a second state such that the first low power memory device and the second low power memory device are operational while the main memory is inoperational during the second state; and during the second state, processing one or more memory requests by using the low power mode page table in the first low power memory device to access the low power mode data stored in the second low power memory device.

18. The computer program product of claim 17, wherein the program code implementing the method further comprises generating the one or more memory requests from a low power subsystem, the low power subsystem comprising at least one of: accelerometer, gyroscope, proximity sensor, an ambient light sensor, air humidity sensor, a barometer sensor, a fingerprint sensor, a magnetometer, a Near-Field-Coupling (NFC) sensor, a pedometer, a microphone, a camera, and a pulse-ox detector.

19. The computer program product of claim 17, wherein the low power mode page table of the first low power mode memory device identifies one or more types of low power modes.

20. The computer program product of claim 17, wherein the first and second low power mode memory devices comprise at least one of: tightly coupled memory and cache memory.

* * * * *